(12) United States Patent
Madrid

(10) Patent No.: US 6,857,459 B1
(45) Date of Patent: Feb. 22, 2005

(54) WIREFILM BONDING FOR ELECTRONIC COMPONENT INTERCONNECTION

(75) Inventor: Ruben P. Madrid, Baguio (PH)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/395,254

(22) Filed: Sep. 13, 1999

Related U.S. Application Data

(62) Division of application No. 08/961,875, filed on Oct. 31, 1997, now Pat. No. 6,006,981.
(60) Provisional application No. 60/031,378, filed on Nov. 19, 1996.

(51) Int. Cl.[7] .............................................. B32B 31/20
(52) U.S. Cl. ....................... 156/542; 428/209; 428/914; 428/202; 428/201; 428/200; 428/195
(58) Field of Search ................................. 156/542, 233, 156/239, 240, 247, 277, 289, 379.7, 344; 428/209, 914, 202, 201, 200, 195; 427/146, 147, 148, 96; 257/672, 688; 228/180.5, 780.21

(56) References Cited

U.S. PATENT DOCUMENTS

| | | | | |
|---|---|---|---|---|
| 3,655,496 A | * | 4/1972 | Ettre et al. | 161/39 |
| 3,724,068 A | * | 4/1973 | Galli | 29/626 |
| 4,650,545 A | * | 3/1987 | Laakso et al. | 156/655 |
| 4,857,671 A | * | 8/1989 | Nakano et al. | 174/68.5 |
| 5,530,282 A | * | 6/1996 | Tsuji | 257/666 |
| 5,554,885 A | * | 9/1996 | Yamasaki et al. | 257/666 |

OTHER PUBLICATIONS

Harper, Charles A, Handbook of Plastics, Elastomers, and Composites, 1992, McGraw–Hill Inc., $2^{nd}$ Edition, pp. 2.41 to 2.4.*

* cited by examiner

*Primary Examiner*—Richard Crispino
*Assistant Examiner*—George R. Koch, III
(74) *Attorney, Agent, or Firm*—Wade James Brady, III; Frederick J. Telecky, Jr.

(57) ABSTRACT

A system (30) is provided for interconnecting a first component (10) having multiple first bonding sites (16) and a second component (12) having multiple second bonding sites (18). The system (30) includes a leadframe (40) coupled to the first component (10) and the second component (12) that advances from a first position (50) to a second position (52). A film tape carrier (32) advances a wirefilm (20) removably coupled to the film tape carrier (32) into the first position (50). The wirefilm (20) includes a substantially planar film (22) and multiple wire strands (14), each wire strand (14) having a first end (24) that contacts a first bonding site (16) and a second end (26) that contacts a second bonding site (18). A film attach tool (62) contacts the first component (10) and the second component (12) with the wirefilm (20) at the first position (50) to interconnect the first component (10) and the second component (12).

17 Claims, 5 Drawing Sheets

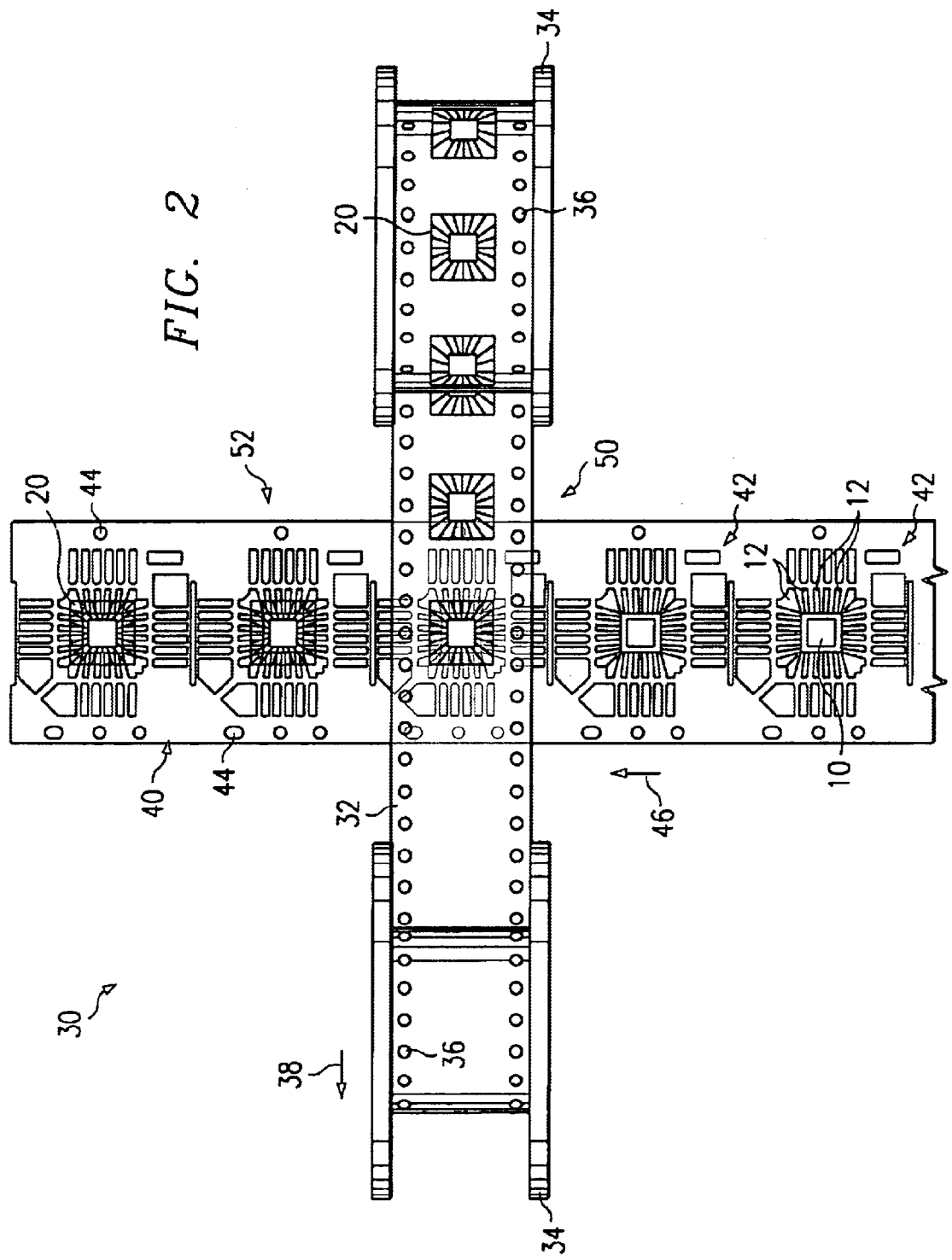

WIREFILM BONDING FOR ELECTRONIC COMPONENT INTERCONNECTION

CROSS REFERENCE TO PRIOR APPLICATIONS

This application is a division of Ser. No. 08/961,875, filed Oct. 31, 1997 now U.S. Pat. No. 6,006,981 which claimed priority based upon provisional application Ser. No. 60/031,378, filed Nov. 19, 1996.

TECHNICAL FIELD OF THE INVENTION

This invention relates in general to the field of electronics packaging, and more particularly to wirefilm bonding for electronic component interconnection.

BACKGROUND OF THE INVENTION

Many components of microelectronic and other devices are interconnected with one or more wires that are bonded to the components in some suitable manner. It is often desirable to increase the speed and efficiency with which these components are interconnected. For example, properly aligning and bonding multiple wires in accordance with the spatial arrangement of components within a device may be relatively time-consuming, machinery and labor intensive, and inefficient, particularly where large numbers of the same or similar devices are to be constructed.

As the microelectronics industry continues to rapidly develop to satisfy increasingly stringent processing and operating requirements, constructing electronic devices efficiently and accurately becomes increasingly important. In particular, techniques used to interconnect components of these devices may play significant roles in the creation or solution of problems associated with these challenges. A known technique for interconnecting components includes attaching integrated circuits or other components to a substrate and sequentially bonding individual wires to the component surfaces to interconnect the components. Despite widespread use, some reliability improvements, and high per-wire yields, such wire bonding techniques are often associated with problems such as wire corrosion, wire breakage, stress-strain mismatches and other reactions associated with interfaces between wires and component bonding pads, and interactions involving various media used for encapsulation or chip attachment.

In addition to these and other shortcomings, these wire bonding techniques have become increasingly inadequate as components become increasingly integrated and require increased precision and efficiency. For example, wire-to-wire shorting often occurs even at 2.8 mils wire-to-wire distance, which is near the practical limit for these techniques but still insufficient for an increasing number of applications. Moreover, even wire bonding techniques employing automation are often too slow, because each wire-to-component bond must be formed sequentially. Although efforts have been made to replace wire bonding techniques for electronic packaging with, for example, tape automated bonding techniques, these efforts have been unsuccessful for many applications.

SUMMARY OF THE INVENTION

In accordance with the present invention, the disadvantages and problems associated with electronic component interconnection have been substantially reduced or eliminated.

In accordance with one embodiment of the present invention, an apparatus is provided for electrically interconnecting a first component having multiple first bonding sites and a second component having multiple second bonding sites. The apparatus includes a substantially planar film and multiple wire strands, each wire strand having a first end and a second end. Each wire strand is coupled to the film according to the relative positions of the first component and the second component. The first end of each wire strand contacts a first bonding site and the second end of each wire strand contacts a second bonding site to electrically interconnect the first component and the second component.

In another embodiment of the present invention, a system is provided for interconnecting a first component having multiple first bonding sites and a second component having multiple second bonding sites. The system includes a leadframe coupled to the first component and the second component that advances from a first position to a second position. A film tape carrier advances a wirefilm removably coupled to the film tape carrier into the first position. The wirefilm includes a substantially planar film and multiple wire strands, each wire strand having a first end that contacts a first bonding site and a second end that contacts a second bonding site. A film attach tool contacts the first component and the second component with the wirefilm at the first position to interconnect the first component and the second component.

Important technical advantages of the present invention include providing an apparatus, system, and method that increases speed and efficiency of packaging electronic components without sacrificing accuracy. The wirefilm of the present invention is compatible with existing component design and provides the opportunity to wholly or partially replace conventional interconnection techniques, which may be relatively complex and time-consuming. As a result, problems such as wire corrosion, wire breakage, stress-strain mismatches and other reactions associated with interfaces between wires and component bonding pads, and interactions involving various media used for encapsulation or chip attachment are reduced or eliminated.

Another important technical advantage of the present invention is that the precise orientation of the wire strands with respect to the first and second components provides an opportunity to design and produce devices having wire-to-wire distances that are less than 2.0 mils pitch and ultra-thin packages. In addition, a variety of bonding techniques may be used in connection with the apparatus, system, and method of the present invention, such as thermocompression bonding, thermosonic bonding, ultrasonic bonding, and laser welding. Moreover, multiple bonds may be formed more or less simultaneously, increasing the speed and efficiency of electronic packaging. Using the wirefilm of the present invention, interconnecting electronic components within microelectronic and other devices is simpler and more efficient, without sacrificing accuracy.

BRIEF DESCRIPTION OF THE DRAWINGS

For a more complete understanding of the present invention and for further features and advantages thereof, reference is now made to the following description taken in conjunction with the accompanying drawings, in which:

FIG. 2 illustrates a system for coupling multiple wirefilms to multiple component sets according to the present invention;

DETAILED DESCRIPTION OF THE INVENTION

Figure 1A:
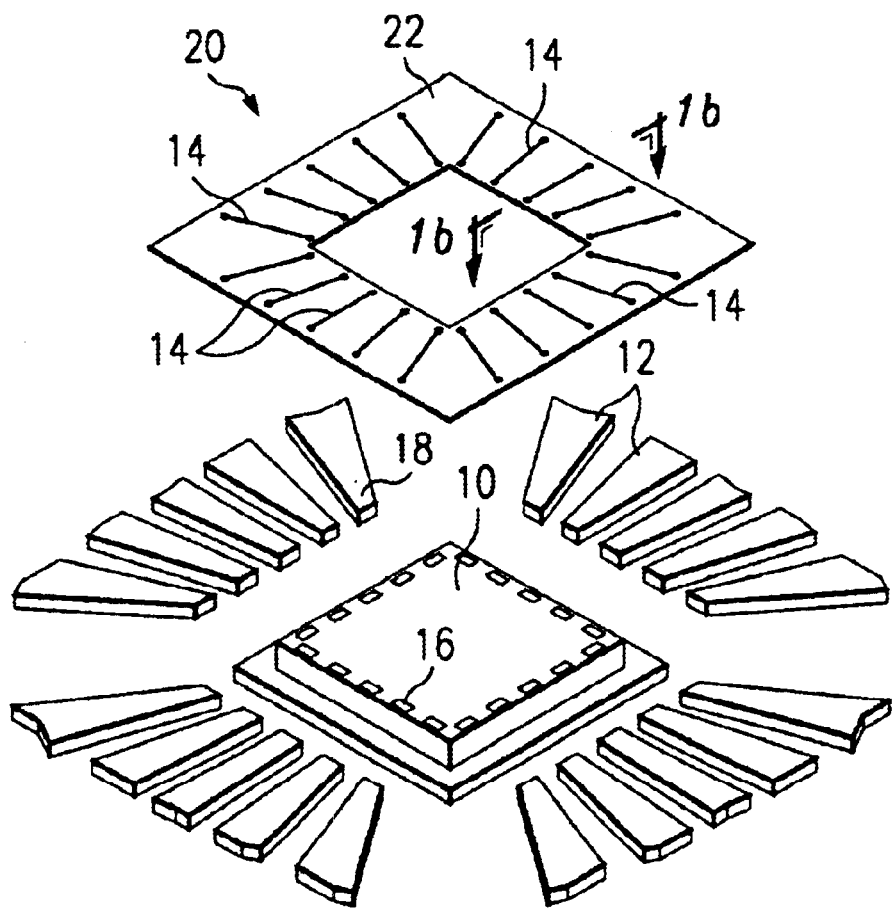
FIGS. 1a and 1b illustrate an exemplary wirefilm and component set according to the teachings of the present invention.

FIG. 1a illustrates a portion of a microelectronic or other device that includes an integrated circuit or semiconductor chip 10 and one or more inner leads 12 associated with chip 10. Although chip 10 and inner leads 12 are discussed, the following discussion applies equally to any other suitable electronic components that may be electrically coupled in accordance with the features and operation of the device. Chip 10 includes one or more chip bonding sites 16 and each inner lead 12 includes one or more lead bonding sites 18. In one embodiment, each chip bonding site 16 corresponds to a particular lead bonding site 18 on a particular inner lead 12.

Wirefilm 20 is spaced apart from chip 10 and inner leads 12. Wirefilm 20 includes a film coating 22 and one or more wire strands 14 oriented so as to align with, match, mirror, or otherwise correspond to the arrangement of chip 10, chip bonding sites 16, inner leads 12, and lead bonding sites 18. The pitch or wire-to-wire distance for wire strands 14 may be selected or determined according to particular needs and, in one embodiment, may be less than 2.0 mils. Film coating 22 may be formed from any suitable polyimide or other plastic polymer and may display temperature resistance up to approximately three hundred degrees Celsius. Wire strands 14 may be formed from one or more suitable electrically conductive materials, such as aluminum, copper, gold, or other metallic, non-metallic, or composite conductor.

Figure 1B:
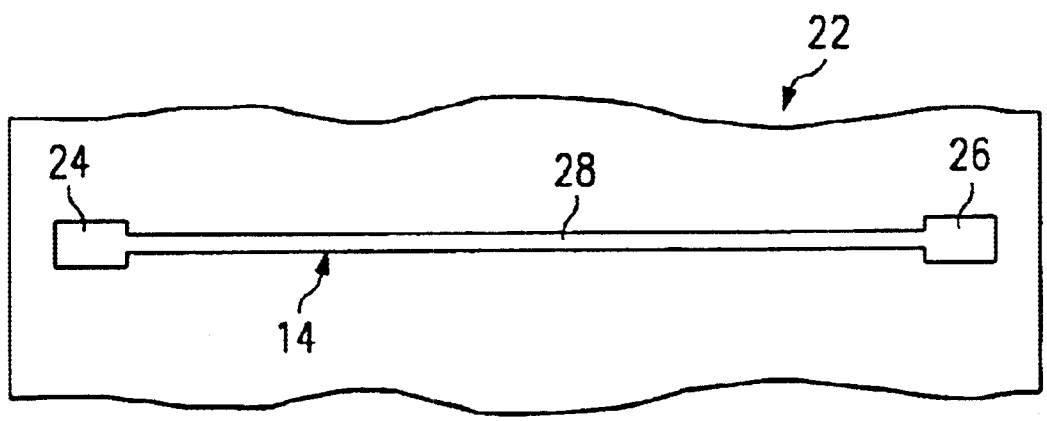

Wire strands 14 may be embedded in, attached to, affixed on, adhered to, or otherwise non-removably or removably coupled to film coating 22. Alternatively, wire strands 14 may be formed within or coupled to film coating 22 using a casting, photoetching, or other suitable process involving film coating 22. In one embodiment, as shown in FIG. 1b, each wire strand 14 is partially embedded in film coating 22, with at least a portion of chip end 24 of wire strand 14 exposed for bonding to a corresponding chip bonding site 16 and at least a portion of lead end 26 of wire strand 14 exposed for bonding to a corresponding lead bonding site 18. Film coating 22 may wrap around, fold over upon, overlap, shield, or otherwise cover some or all of a central portion 28 of wire strand 14 between chip end 24 and lead end 26. In addition to supporting wire strands 14 prior to bonding to chip 10 and inner leads 12, film coating 22 may protect wire strands 14 from damage or wire sweeping during encapsulation. Wire strands 14 may be coupled to film coating 22 in any suitable manner to form wirefilm 20.

FIG. 2 illustrates an automated system 30 for coupling wire strands 14 of multiple wirefilms 20 to multiple sets of electronic components, such as chip 10 and inner leads 12, to interconnect these components according to the design of the corresponding device. Wirefilms 20 are removably coupled to wirefilm tape carrier 32, which may be formed from any suitable commercially available plastic polymer or other appropriate material. During operation of system 30, wirefilms 20 are removed from film tape carrier 32 and coupled to chips 10 and inner leads 12 of component sets 42.

Film tape carrier 32 is wound around reels 34, for example, in a manner similar to the winding of motion picture film, and has one or more indexing holes 36 for accurately indexing the advancement of film tape carrier 32 and wirefilms 20. Reels 34 may be cylindrical or may have any other suitable shape. Indexing holes 36 may be formed mechanically using a punch and die, cut using a laser, or created in any other suitable manner. In one embodiment, reels 34 have teeth that engage indexing holes 36 of film tape carrier 32 to advance film tape carrier 32 and wirefilms 20 in the direction indicated by arrow 38.

Leadframe 40 supports multiple sets 42 of electronic components, each component set 42 including a chip 10 and one or more inner leads 12. In one embodiment, leadframe 40 is a substantially continuous roll, film, sheet, strip, or other construction, for example, a stiffener strip formed from copper, nickel, or other suitable metallic, non-metallic, or composite material or combination of materials. Since leadframe 40 is substantially continuous, system 30 is able to advance leadframe 40 to efficiently couple multiple wirefilms 20 to multiple component sets 42 on leadframe 40. Although chip 10 and inner leads 12 are discussed, wirefilms 20 may be used to interconnect any other suitable components of microelectronic or other devices. Leadframe 40 may have one or more indexing holes 44 for accurately indexing the advancement of leadframe 40 and component sets 42 to coordinate with the advancement of film tape carrier 32 and wirefilms 20. Like indexing holes 36, indexing holes 44 may be formed mechanically using a punch and die, cut using a laser, or created in any other suitable manner.

In one embodiment, system 30 advances leadframe 40 periodically in a direction indicated by arrow 46 and, in coordination, periodically advances film tape carrier 32 in the direction indicated by arrow 38, such that each wirefilm 20 may be accurately aligned with and coupled to a corresponding component set 42 at attach station 50 where film tape carrier 32 and leadframe 40 overlap. Chip ends 24 and lead ends 26 of each wire strand 14 are spaced apart from corresponding chip bonding sites 16 and lead bonding sites 18, respectively. In one embodiment, the directions in which system 30 advances leadframe 40 and film tape carrier 32 are perpendicular to one another, but leadframe 40 and film tape carrier 32 may be arranged in a parallel or other suitable relationship. As discussed more fully below, system 30 advances each wirefilm 20 into a first position at film attach station 50 where film tape carrier 32 and leadframe 40 overlap, couples wirefilm 20 to a corresponding component set 42 with wire strands 14 in a suitable orientation with respect to chip 10 and inner leads 12, advances wirefilm 20 into a second position at film bonding station 52, bonds wire strands 14 to bonding sites 16 and 18, and advances wirefilm 20 from bonding station 52 for further processing.

Figure 3A:
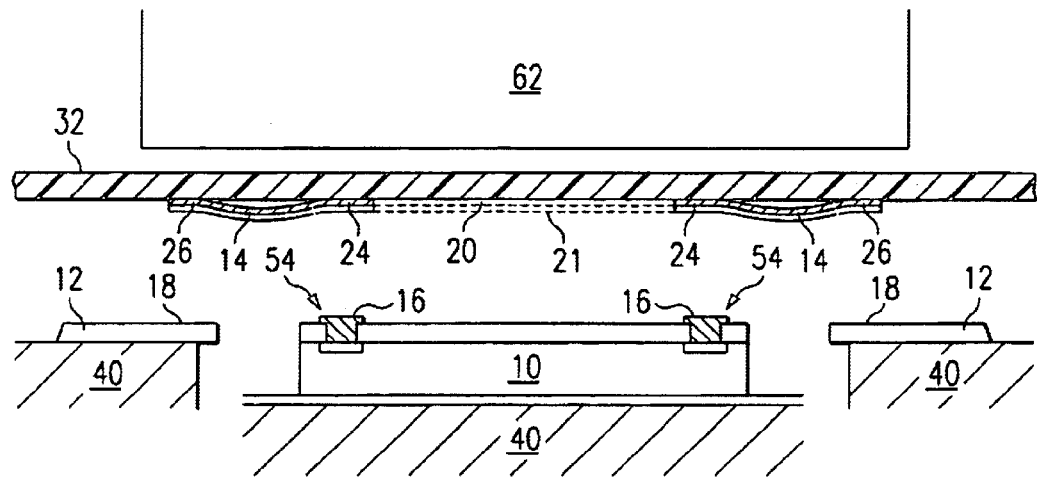
FIG. 3a illustrates a wirefilm positioned above a component set.

FIG. 3a illustrates wirefilm 20 removably coupled to film tape carrier 32 and spaced apart from chip 10 and inner leads 12 at attach station 50 where film tape carrier 32 overlaps leadframe 40. Chip ends 24 and lead ends 26 of wire strands 14 are properly aligned with chip bonding sites 16 and lead bonding sites 18, respectively. In one embodiment, wire strands 14 are slightly looped or relaxed between chip ends 24 and lead ends 26 to reduce tension in wire strands 14 that may occur during bonding or during encapsulation due to expansion of materials that form wire strands 14 or bonding sites 16 and 18 in response to an increase in temperature.

Chip 10 may have one or more bonding pads 54 that are associated with and wholly or partially form chip bonding sites 16. Leadframe 40 may include one or more elevated, depressed, or other structures or portions configured to properly position and provide support to chip 10 and inner leads 12. In one embodiment, the surface of wirefilm 20 facing the component set is wholly or partially coated with an appropriate adhesive 21 to ensure that the orientation of wire strands 14 with respect to chip 10 and inner leads 12 is maintained before, during, and after system 30 brings wirefilm 20 into contact with chip 10 and inner leads 12. System 30 may separate or otherwise remove film coating 22 from wire strands 14, at film attach station 50 or elsewhere, in response to coupling wire strands 14 to chip 10 and inner leads 12.

Figure 3B:
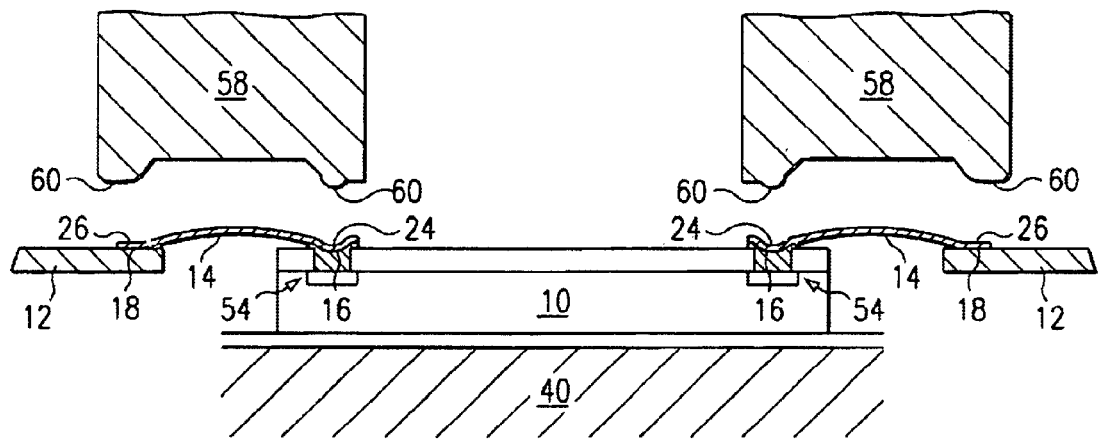
FIG. 3b illustrates a wirefilm bonded to a component set.

FIG. 3b illustrates chip ends 24 and lead ends 26 of wire strands 14 bonded to chip bonding sites 16 and lead bonding sites 18, respectively. Although film coating 22 is not shown coupled to wire strands 14, wire strands 14 may remain coupled to film coating 22 or may be separated from film coating 22 before, during, or after wire strands 14 are bonded to bonding sites 16 and 18. Bonding tool 58 bonds wire strands 14 to chip 10 and inner leads 12 at film bonding station 52 using laser welding, thermocompression bonding, ultrasonic bonding, thermosonic bonding, solder reflow, dynamic alloy formation, or any other suitable bonding technique. Wire strands 14 may be bonded to chip 10 and inner leads 12 sequentially, for example, using a single point bonding technique, one bond or wire strand 14 at a time. Alternatively, for increased speed, bonding tool 58 may gang bond, mass bond, or otherwise process multiple bonds or wire strands 14 simultaneously, according to particular needs.

In one embodiment, bonding tool 58 includes one or more thermocompression electrodes or heat sinks having one or more bonding points 60 arranged in accordance with the configuration of bonding sites 16 and 18. Bonding points 60 may be wholly or partially coated with diamond or another suitable material to promote wear resistance. If all bonds for a particular component set 42 are not formed simultaneously at film bonding station 50, such as for single point bonding, the movements of one or more bonding points 60 at film bonding station 50 may be determined or controlled according to data stored in one or more tables of a suitable computer memory associated with bonding tool 58. The present invention contemplates system 30 moving leadframe 40 instead of, or in addition to, bonding points 60 to bond wire strands 14 of a particular wirefilm 20 to a particular component set 42.

Figure 4A:
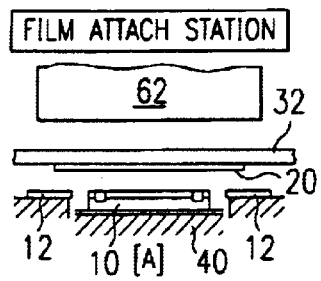
FIGS. 4a through 4g illustrate an exemplary method of coupling multiple wirefilms to multiple component sets according to the present invention.

FIGS. 4a through 4g illustrate a method of coupling wire strands 14 for multiple wirefilms 20 to corresponding component sets 42, each of which includes chip 10 and inner leads 12. In FIG. 4a, film tape carrier 32 and a first wirefilm 20 are positioned between a film attach tool 62 and a corresponding first component set 42, labeled "[A]" in FIGS. 4a through 4g. In one embodiment, film attach tool 62 has a more or less planar lower surface that is configured according to the arrangement of chip 10 and inner leads 12. Film attach tool 62 may be constructed from copper or any other suitable metallic, non-metallic, or composite material.

Figure 4B:
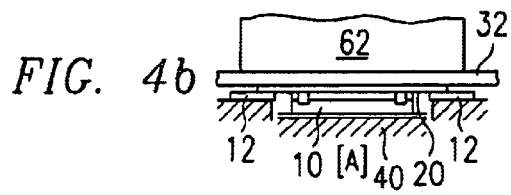
Figure 4C:
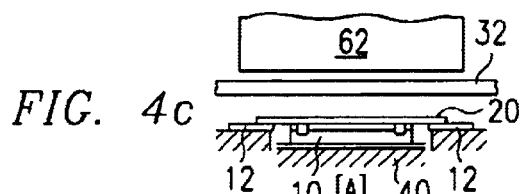

As shown in FIG. 4b, film attach tool 62 moves downward to couple first wirefilm 20 to chip 10 and inner leads 12 of first component set 42. In one embodiment, film attach tool 62 applies a suitable amount of heat, pressure, or both heat and pressure to wirefilm 20, in cooperation with the adhesive properties of the exposed lower surface of first wirefilm 20, to couple first wirefilm 20 to chip 10 and inner leads 12. Each wire strand 14 is oriented such that chip ends 24 and lead ends 26 of wire strands 14 are aligned with corresponding bonding sites 16 and 18, respectively. As shown in FIG. 4c, film attach tool 62 separates or removes first wirefilm 20 from film tape carrier 32 and moves upward, allowing film tape carrier 32 to move upward while first wirefilm 20 remains coupled to chip 10 and inner leads 12.

Figure 4D:
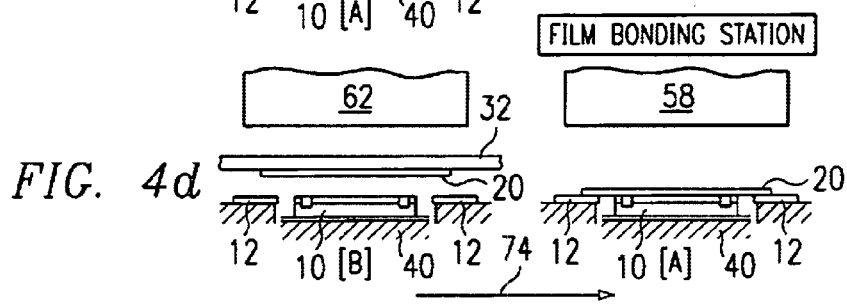

In FIG. 4d, as indicated by arrow 74, system 30 has advanced leadframe 40 to advance first component set 42 from film attach station 50 to film bonding station 52 and, at approximately the same time, to advance a second component set 42 to film attach station 50. Second component set 42 is labeled "[B]" in FIGS. 4d through 4g. System 30 has also advanced film tape carrier 32 to advance a second wirefilm 20 into position between second component set 42 and film attach tool 62 at film attach station 50. In one embodiment, film tape carrier 32 and leadframe 40 are advanced substantially perpendicular to one another, such that film tape carrier 32 is advanced generally into or out of the plane of the page as leadframe 40 is advanced in the direction of arrow 74. Bonding tool 58 is positioned above first wirefilm 20 and first component set 42 at film bonding station 52.

Figure 4E:
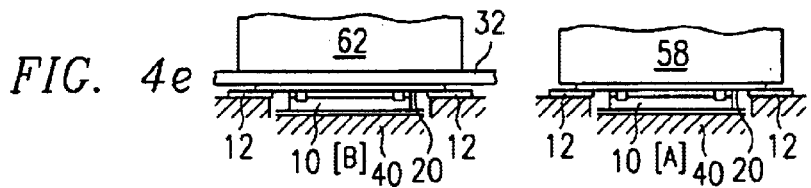
Figure 4F:
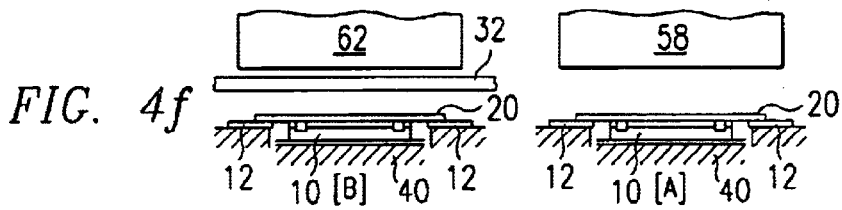

In FIGS. 4d through 4f, the processing discussed above with reference to FIGS. 4a through 4c for first wirefilm 20 and first component set 42 occurs at film attach station 50 with respect to second wirefilm 20 and second component set 42. More or less simultaneously with the processing of second wirefilm 20 and second component set 42 at film attach station 50, bonding tool 58 moves downward, serially or simultaneously bonds wire strands 14 of first wirefilm 20 to bonding sites 16 and 18, and moves upward after bonding has been completed.

Figure 4G:
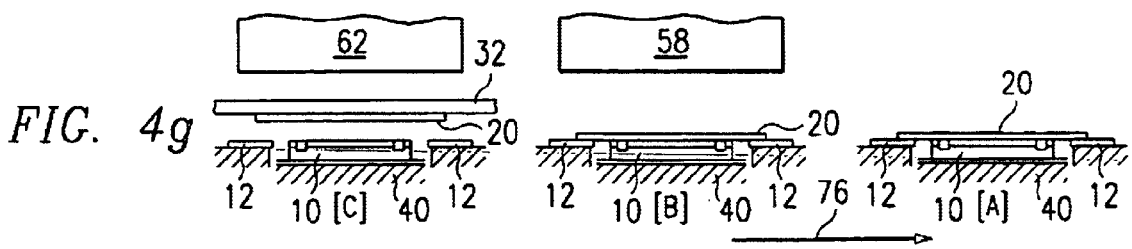

As shown in FIG. 4g, after processing has completed at film attach station 50 with respect to second wirefilm 20 and second component set 42, and at film bonding station 52 with respect to first wirefilm 20 and first component set 42, system 30 again advances leadframe 40 as indicated by arrow 76. As a result, first component set 42 and first wirefilm 20 are advanced from film bonding station 52 for further processing or other suitable activity, second component set 42 and second wirefilm 20 are advanced from film attach station 50 to film bonding station 52 for bonding, and a third component set 42 and a third wirefilm 20 are advanced into position at film attach station 50. Third component set 42 is labeled "[C]" in FIG. 4g. The process discussed above may be repeated more or less continuously to generate multiple component sets 42 that have been accurately and efficiently interconnected using wirefilm bonding.

Although the attachment of wirefilm 20 to component set 42 and the bonding of wire strands 14 to bonding sites 16 and 18 are discussed as separate process steps, the present invention contemplates attaching wirefilm 20 and bonding wire strands 14 more or less simultaneously. For example, system 30 may include a composite film attach and bonding tool to perform these operations at one location, such as a composite film attach and bonding station, at approximately the same time.

Figure 5A:
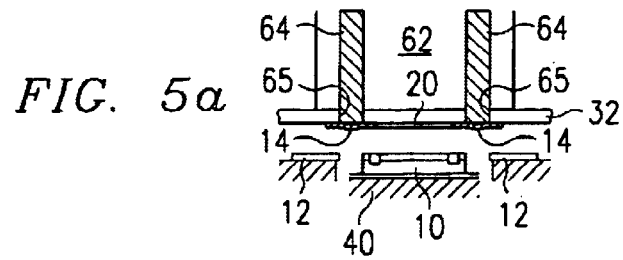
FIGS. 5a through 5d illustrate an exemplary method of attaching a wirefilm to a component set.
Figure 5B:
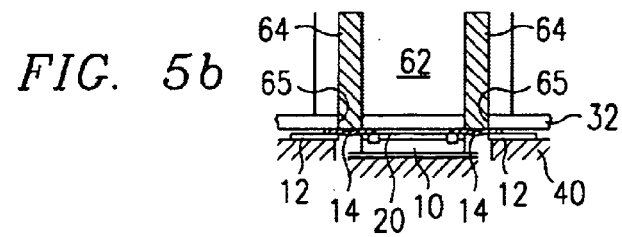

FIGS. 5a through 5d illustrate a method of coupling wirefilm 20 to component set 42 using film attach tool 62. As shown in FIG. 5a, film attach tool 62 is associated with one or more push tools 64 that are integral to or separate from film attach tool 62. Film attach tool 62, push tools 64, or both film attach tool 62 and push tools 64 hold, adhere to, or otherwise support film tape carrier 32 and wirefilm 20 such that wire strands 14 are positioned over and aligned with appropriate portions of chip 10 and inner leads 12. In one embodiment, push tools 64 extend, pass, or move through openings 65 in film tape carrier 32 according to the processing of film attach tool 62 at film attach station 50. In FIG. 5b, film attach tool 62 has moved downward to cause wirefilm 20 to contact and adhere to chip 10 and inner leads 12. Chip ends 24 and lead ends 26 of wire strands 14 are suitably aligned with and in position for bonding to chip bonding sites 16 and lead bonding sites 18, respectively.

Figure 5C:
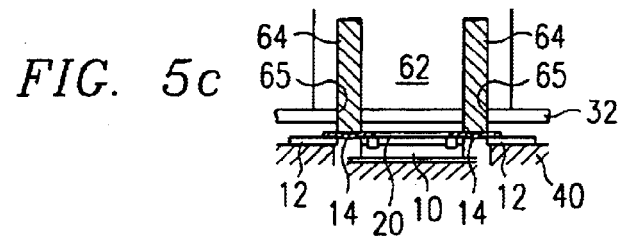
Figure 5D:
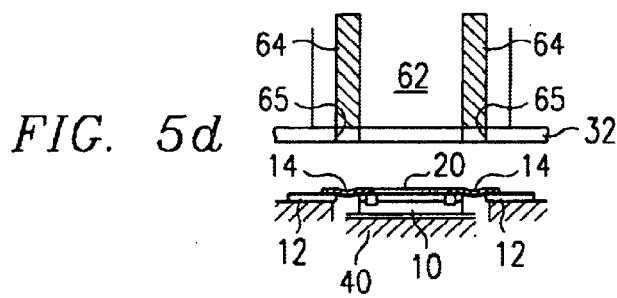

As shown in FIG. 5c, film attach tool 62 retracts along with film tape carrier 32 while push tools 64 remain in contact with wire strands 14 through openings 65. Push tools 64 exert sufficient force on wire strands 14, using one or more springs or other suitable mechanism, to cause wire strands 14 to adhere to bonding sites 16 and 18 while separating wirefilm 20 from film tape carrier 32. In one embodiment, wirefilm 20 and wire strands 14 are at this point more or less permanently coupled to chip 10 and inner leads 12. As shown in FIG. 5d, film attach tool 62 has returned to its original upward position and push tools 64 have retracted out of openings 65 to allow film tape carrier 32 to advance another wirefilm 20 into position at film attach station 50. The coupling of wirefilm 20 to chip 10 and inner leads 12 is then complete. The present invention contemplates affixing, attaching, or otherwise coupling wirefilm 20 and wire strands 14 to component set 42 in any manner suitable to properly orient wire strands 14 for bonding to bonding sites 16 and 18.

Figure 6:
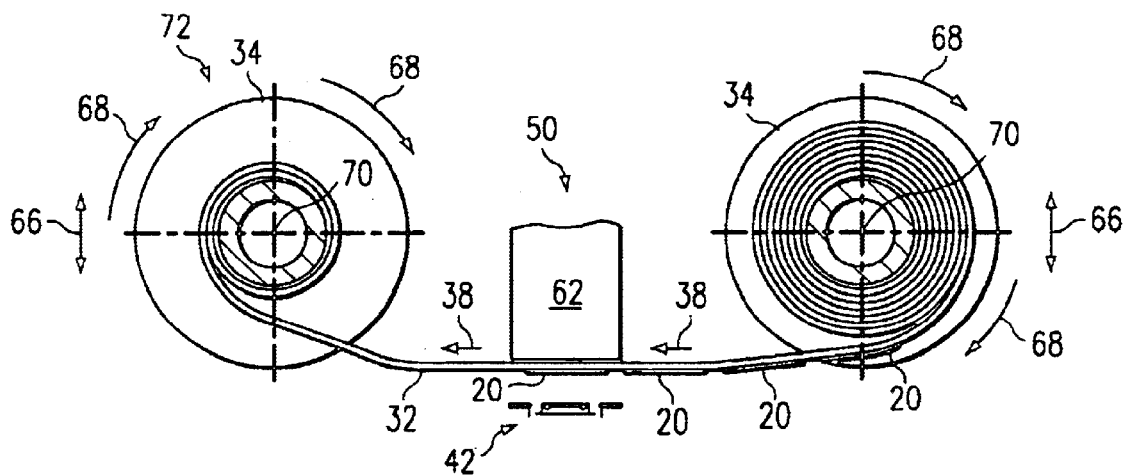
FIG. 6 illustrates an exemplary advancement assembly for advancing a film tape carrier.

FIG. 6 illustrates reels 34 supporting film tape carrier 32 and multiple wirefilms 20. Film attach tool 62 is positioned above first wirefilm 20 and corresponding first component set 42 that includes chip 10 and inner leads 12 at film attach station 50. In one embodiment, as indicated by arrows 66, the entire advancement assembly 72 of system 30 that includes reels 34 moves upward and downward relative to leadframe 40 and component set 42 as film attach tool 62 moves upward and downward to couple first wirefilm 20 to chip 10 and inner leads 12. As a result, distortion of first wirefilm 20 is prevented or reduced such that chip ends 24 and lead ends 26 of wire strands 14 accurately align with bonding sites 16 and 18, respectively.

In one embodiment, reels 34 advance film tape carrier 32 in the direction of arrow 38 as reels 34 rotate around axes 70 in the direction of arrows 68. System 30 may advance film tape carrier 32 in any suitable manner. As discussed above with reference to FIGS. 4a through 4g, after first wirefilm 20 has been coupled to chip 10 and inner leads 12 of first component set 42 at film attach station 50, system 30 advances first wirefilm 20 and first component set 42 to film bonding station 52 and, more or less simultaneously, advances second wirefilm 20 and second component set 42 into position at film attach station 50. Advancement assembly 72 and film attach tool 62 cooperate with leadframe 40 to accurately and efficiently couple multiple wirefilms 20 to multiple component sets 42 in succession.

Although the present invention has been described above in connection with several embodiments, it should be understood that a plethora of changes, substitutions, variations, alterations, transformations, and modifications may be suggested to one skilled in the art, and it is intended that the present invention encompass such changes, substitutions, variations, alterations, transformations, and modifications as fall within the spirit and scope of the appended claims.

What is claimed is:

1. A wirefilm for electrically interconnecting a first component having a plurality of first bonding sites and a second component having a plurality of second bonding sites, the wirefilm comprising:

a discontinuously movable, substantially planar film; and a plurality of spaced apart groups of wire strands, each group of said plurality of groups extending generally outwardly from a central region in a non-overlapping different direction, each wire strand of each group of wire strands having a first end and an opposing second end, the first end of each wire strand of each of said groups of wire strands operable to contact a said second bonding site to electrically interconnect the first component and the second component, each wire strand between the first end and the second end being substantially fully embedded in said film except for said first and second ends.

2. The wirefilm of claim 1, wherein the film comprises a plastic polymer.

3. The wirefilm of claim 1, further comprising an adhesive layer operable to couple the wirefilm to the first component and the second component.

4. The wirefilm of claim 1, further comprising an film tape carrier removably coupled to the film, the film tape carrier operable to advance the film from a first position to a second position.

5. A wirefilm for electrically interconnecting a first component having a plurality of first bonding sites and a second component having a plurality of second bonding sites, the wirefilm comprising:

a substantially planarizable film; and a plurality of wire strands, each wire strand having a first end and a second end, each wire strand coupled to the film according to the relative positions of the first component and the second component, the first end of each wire strand operable to contact a first bonding site and the second end of each wire strand operable to contact a second bonding site to electrically interconnect the first component and the second component, each wire strand comprising a loop portion relaxed and located entirely between the first end and the second end, the loop portion spaced apart from said film;

wherein at least a portion of each wire strand between the first end and the second end is embedded in said film.

6. A wirefilm for electrically interconnecting a first component having a plurality of first bonding sites and a second component having a plurality of second bonding sites, the wirefilm comprising:

a discontinuously movable substantially planar film; and a plurality of spaced apart groups of wire strands, each group of said plurality of groups extending generally outwardly from a central region in a non-overlapping different direction, each wire strand of each group of wire strands having a first end and a second end, the first end of each wire strand of each group of wire strands operable to contact a said first bonding site and the second end of each wire strand of one of said groups of wire strands operable to contact a said second bonding site to electrically interconnect the first component and the second component, each wire strand comprising a loop portion relaxed and located entirely between the first end and the second end, the loop portion spaced apart from said film.

7. The wirefilm of claim 6 wherein the film comprises a plastic polymer.

8. The wirefilm of claim 6 further comprising an adhesive layer operable to couple the wirefilm to the first component and the second component.

9. The wirefilm of claim 6 further comprising a film tape carrier removably coupled to the film, the film tape carrier operable to advance the film from a first position to a second position.

10. Apparatus for making an electrical connection between a first component and a second component with a wirefilm which comprises:

a first component having first bonding sites thereon;

a second component having second bonding sites thereon; and a discontinuously movable wirefilm for electrically interconnecting bonding sites of said first component and said second component sites, the wirefilm comprising:

a substantially planar film; and a plurality of spaced apart groups of wire strands, each group of said plurality of groups extending generally outwardly from a central region in a non-overlapping different direction, each wire strand of each group of wire strands having a first end and an opposing second end, the first end of each wire strand of each group of wire strands contacting a said first bonding site and the second end of each wire strand of one of said groups of wire strands contacting a second bonding site to electrically interconnect the first component and the second component, each wire strand between the first end and the second end being embedded in said film.

11. The apparatus of claim 10 further comprising an adhesive layer operable to couple the wirefilm to the first component and the second component.

12. The apparatus of claim 10 further comprising a film tape carrier removably coupled to the film, the film tape carrier operable to advance the film from a first position to a second position.

13. Apparatus for making an electrical connection between a first component and a second component with a wirefilm which comprises:

a first component having first bonding sites thereon;

a second component having second bonding sites thereon; and a wirefilm for electrically interconnecting bonding sites of said first component and said second component sites, the wirefilm comprising:

a discontinuously movable substantially planar film; and a plurality of spaced apart groups of wire strands, each group of said plurality of groups extending generally outwardly from a central region in a non-overlapping different direction, each wire strand of each group of wire strands having a first end and a second end, the first end of each wire strand of one of said groups of wire strands operable to contact a first bonding site and the second end of each wire strand of one of said groups of wire strands operable to contact a second bonding site to electrically interconnect the first component and the second component, each wire strand comprising a loop portion relaxed and located entirely between the first end and the second end, the loop portion spaced apart from said film.

14. The apparatus of claim 13 wherein the film comprises a plastic polymer.

15. The apparatus of claim 13 wherein at least a portion of each wire strand between the first end and the second end is embedded in said film.

16. The apparatus of claim 13 further comprising an adhesive layer operable to couple the wirefilm to the first component and the second component.

17. The apparatus of claim 13 further comprising a film tape carrier removably coupled to the film, the film tape carrier operable to advance the film from a first position to a second position.

* * * * *